US011085766B2

(12) United States Patent
Acar et al.

(10) Patent No.: US 11,085,766 B2
(45) Date of Patent: Aug. 10, 2021

(54) MICROMACHINED MULTI-AXIS GYROSCOPES WITH REDUCED STRESS SENSITIVITY

(71) Applicant: SEMICONDUCTOR COMPONENTS INDUSTRIES, LLC, Phoenix, AZ (US)

(72) Inventors: Cenk Acar, Santa Clara, CA (US); Brenton Simon, Fremont, CA (US); Sandipan Maity, San Carlos, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 306 days.

(21) Appl. No.: 16/143,772

(22) Filed: Sep. 27, 2018

(65) Prior Publication Data

US 2019/0145772 A1    May 16, 2019

Related U.S. Application Data

(60) Provisional application No. 62/584,361, filed on Nov. 10, 2017.

(51) Int. Cl.
*G01C 19/5712* (2012.01)
*G01C 19/5656* (2012.01)
*B81C 1/00* (2006.01)
*B81B 3/00* (2006.01)

(52) U.S. Cl.
CPC ........ *G01C 19/5712* (2013.01); *B81B 3/0018* (2013.01); *B81C 1/00134* (2013.01); *G01C 19/5656* (2013.01); *B81B 2201/0242* (2013.01); *B81B 2203/056* (2013.01)

(58) Field of Classification Search
CPC ............ G01C 19/5712; G01C 19/5656; B81C 1/00134; B81B 3/0018; B81B 2203/056; B81B 2201/0242
USPC ........................................................ 73/504.12
See application file for complete search history.

(56) References Cited

U.S. PATENT DOCUMENTS

| | | | | | |
|---|---|---|---|---|---|
| 7,134,340 | B2* | 11/2006 | Samuels | ............... | B81B 3/0072 73/514.32 |
| 7,240,552 | B2* | 7/2007 | Acar | .................. | G01C 19/5712 73/504.12 |
| 7,461,552 | B2* | 12/2008 | Acar | ..................... | G01P 15/125 73/504.04 |
| 8,272,267 | B2* | 9/2012 | Tamura | .............. | G01C 19/5712 73/504.12 |
| 8,353,212 | B2* | 1/2013 | Hammer | ............ | G01C 19/5712 73/504.12 |
| 8,616,057 | B1* | 12/2013 | Mao | ..................... | G01C 19/574 73/504.14 |
| 8,739,626 | B2 | 6/2014 | Acar | | |
| 8,813,564 | B2 | 8/2014 | Acar | | |

(Continued)

*Primary Examiner* — Nathaniel T Woodward
(74) *Attorney, Agent, or Firm* — Brake Hughes Bellermann LLP

(57) ABSTRACT

In a general aspect, a micromachined gyroscope can include a substrate and a static mass suspended in an x-y plane over the substrate by a plurality of anchors attached to the substrate. The static mass can be attached to the anchors by anchor suspension flexures. The micromachined gyroscope can include a dynamic mass surrounding the static mass and suspended from the static mass by one or more gyroscope suspension flexures.

20 Claims, 16 Drawing Sheets

(56) References Cited

U.S. PATENT DOCUMENTS

| | | | |
|---|---|---|---|
| 8,960,002 B2* | 2/2015 | Nasiri | G01P 15/0888 |
| | | | 73/514.02 |
| 9,003,882 B1* | 4/2015 | Ayazi | G01C 19/56 |
| | | | 73/504.12 |
| 9,095,072 B2 | 7/2015 | Bryzek et al. | |
| 9,246,018 B2 | 1/2016 | Acar | |
| 9,278,845 B2 | 3/2016 | Acar | |
| 9,278,846 B2* | 3/2016 | Acar | G01P 15/125 |
| 9,352,961 B2 | 5/2016 | Acar et al. | |
| 9,452,921 B2* | 9/2016 | Blomqvist | B81B 7/0058 |
| 2015/0059473 A1* | 3/2015 | Jia | G01C 19/5747 |
| | | | 73/504.12 |
| 2015/0114112 A1* | 4/2015 | Valzasina | G01C 19/56 |
| | | | 73/504.12 |

\* cited by examiner

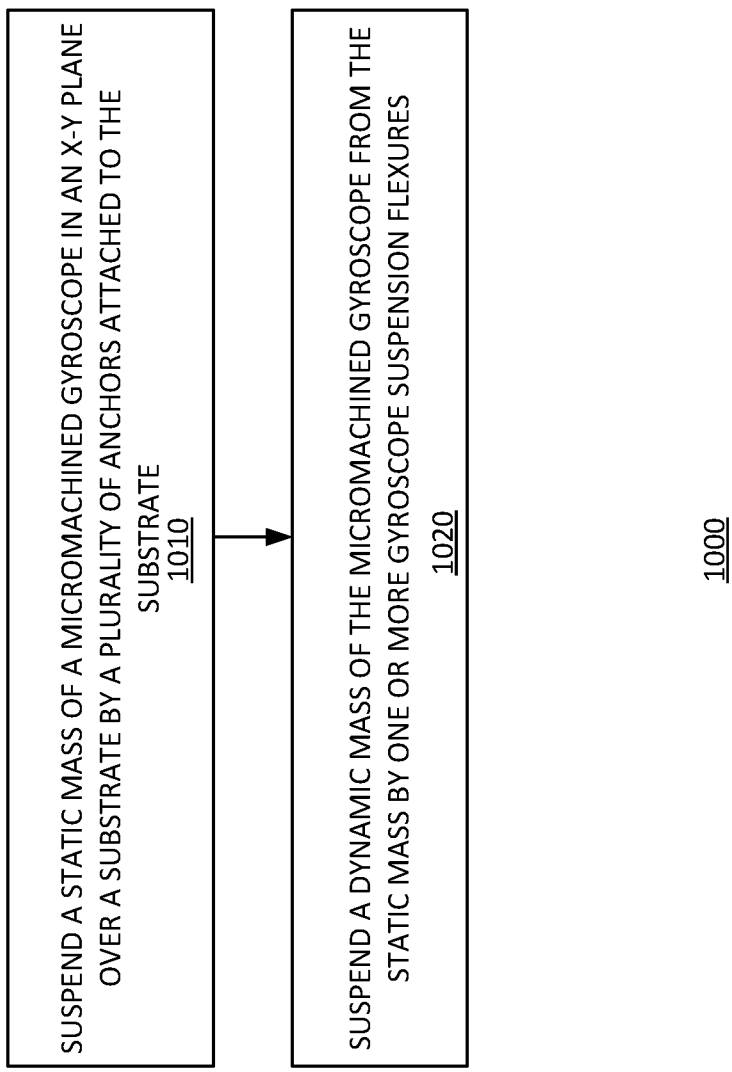

MICROMACHINED MULTI-AXIS GYROSCOPES WITH REDUCED STRESS SENSITIVITY

RELATED APPLICATION

This application claims priority to and the benefit of U.S. Provisional Application No. 62/584,361, entitled "MICROMACHINED MULTI-AXIS GYROSCOPES WITH REDUCED STRESS SENSITIVITY," filed on Nov. 10, 2017, which is incorporated by reference in its entirety herein.

TECHNICAL FIELD

The present disclosure relates to micro machined multi-axis gyroscopes.

BACKGROUND

A micromachined gyroscope is a type of inertial sensor which can be used to measure angular rate or attitude angle. Several single-axis or multi-axis micromachined microelectromechanical systems (MEMS) gyroscopes have been integrated into various systems (e.g., systems for balance, guidance or navigation). As the size of such gyroscopes becomes smaller and the desired sensitivity increases, small scale stresses on certain components of the gyroscopes can detract from the accuracy of the sensors.

SUMMARY

In a general aspect, a micromachined gyroscope can include a substrate and a static mass suspended in an x-y plane over the substrate by a plurality of anchors attached to the substrate. The static mass can be attached to the anchors by anchor suspension flexures. The micromachined gyroscope can include a dynamic mass surrounding the static mass and suspended from the static mass by one or more gyroscope suspension flexures.

BRIEF DESCRIPTION OF THE DRAWINGS

FIG. 10 illustrates an example method for mitigating or averaging deformation displacements across a substrate in a micromachined gyroscope.

DETAILED DESCRIPTION

Micromachined gyroscopes include mechanical components that can be made of silicon. These mechanical structures may include components that have dimensions on the order of a few to tens of microns thick. Commonly, micromachined gyroscopes are enclosed in MEMS packages, which are fabricated using, for example, off-the-shelf packaging techniques and material derived from the semiconductor microelectronics field. A MEMS package may provide, for example, some mechanical support, protection from the environment, and electrical connection to other system components. However, in the field, the MEMS package may itself be subject to mechanical and or thermal stress, which can propagate to and warp the enclosed gyroscope substrate and components. Such packaging induced stress or substrate stress induced deformation of gyroscope components remains a concern (e.g., for high performance gyroscopes) since it directly affects the performance of the enclosed micromachined gyroscope in operation.

This disclosure describes example micromachined multi-axis gyroscope structures formed in an x-y plane of a device layer that have reduced sensitivity to substrate stress or deformation.

In an example, a 3-axis gyroscope may have a single planar proof mass design providing 3-axis gyroscope operational modes. The planar proof-mass in the device layer can be symmetrically suspended from a substrate (or anchored to substrate) using a configuration of geometrically-distributed anchors and one or more symmetrical flexure bearings (which can be referred to as flexures), in accordance with the principles of the present disclosure. In an example implementation the planar proof-mass is suspended from a set of four anchors attached to the substrate. Further, the flexures can include x, y, and z-axis flexure bearings.

The multiple geometrically-distributed anchors can track substrate deformation and can physically modify the out-of-plane capacitive gaps of measurement electrodes in the gyroscope that measure X-axis and Y-axis rates (accelerations) of the proof mass to compensate for the substrate deformation. For example, the out-of-plane capacitive gaps of the electrodes can be averaged across two anchors in each of the X and Y dimensions.

Figure 1:
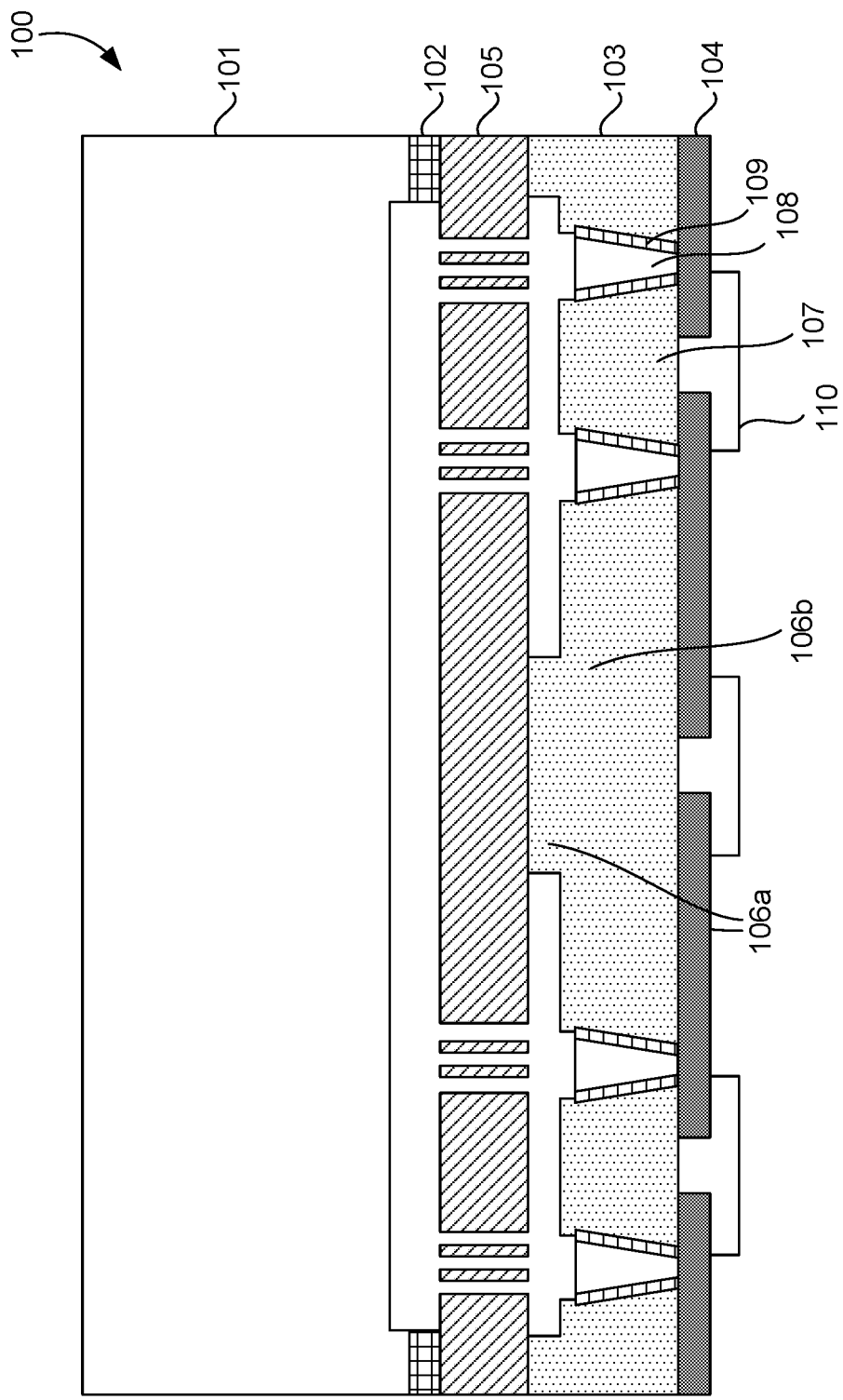
FIG. 1 is an illustration of a 3-degrees-of-freedom (3-DOF) inertial measurement unit (IMU), in accordance with the principles of the present disclosure.

FIG. 1 is a schematic cross-sectional view of a 3-degrees-of-freedom (3-DOF) inertial measurement unit (IMU) 100, in accordance with the principles of the present disclosure.

IMU 100 includes a 3-DOF gyroscope or a 3-DOF micromachined accelerometer, formed in a chip-scale package including a cap wafer 101, a device layer 105 including micromachined structures (e.g., a micromachined 3-DOF IMU), and a substrate or via wafer 103. Device layer 105 can be sandwiched between cap wafer 101 and via wafer 103, and the cavity between device layer 105 and cap wafer 101 can be sealed under vacuum at the wafer level.

In an example, cap wafer 101 can be bonded to the device layer 105 using, for example, a metal bond 102. Metal bond 102 can include a fusion bond, such as a non-high temperature fusion bond, to allow getter to maintain long term vacuum and application of anti-stiction coating to prevent stiction that can occur to low-g acceleration sensors. In an example, during operation of device layer 105, metal bond 102 can generate thermal stress between cap wafer 101 and device layer 105. In certain examples, one or more features can be added to device layer 105 to isolate the micromachined structures in the device layer 105 from thermal stress, such as one or more stress reducing grooves formed around the perimeter of the micromachined structures. In an example, via wafer 103 can be bonded to device layer 105 (e.g., silicon-silicon fusion bonded, etc.) to obviate thermal stress between via wafer 103 and device layer 105.

In an example, via wafer 103 can include one or more isolated regions, such as a first isolated region 107, isolated from one or more other regions of via wafer 103, for example, using one or more through-silicon-vias (TSVs), such as a first TSV 108 insulated from via wafer 103 using a dielectric material 109. In certain examples, the one or more isolated regions can be utilized as electrodes to sense or actuate out-of-plane operation modes of the 3-axis inertial sensor, and the one or more TSVs can be configured to provide electrical connections from device layer 105 outside of IMU 100. Further, via wafer 103 can include one or more contacts, such as a first contact 110, selectively isolated from one or more portions of via wafer 103 using a dielectric layer 104 and configured to provide an electrical connection between one or more of the isolated regions or TSVs of via wafer 103 to one or more external components, such as an ASIC wafer, using bumps, wire bonds, or one or more other electrical connection.

In accordance with the principles of the present disclosure, a 3-degrees-of-freedom (3-DOF) gyroscope or the micromachined accelerometer in device layer 105 can be supported or anchored to via wafer 103 by bonding device layer 105 to a plurality of protruding portions of via wafer 103 (e.g., anchor 106a and anchor 106b that are seen in the cross sectional view of FIG. 1). The plurality of protruding portions of via wafer 103 (e.g., anchor 106a and anchor 106b) are located at a substantial distance from the center of the via wafer 103, and device layer 105 can, for example, be fusion bonded to the anchor 106a and anchor 106b (e.g., to eliminate problems associated with metal fatigue).

In an example implementation, four off-center anchors can be symmetrically located at corners of a geometrical square (i.e. with each anchor being at a same radial distance from the center of the square) to support the gyroscope or the micromachined accelerometer in device layer 105 on the substrate (i.e., wafer 103). The four off-center anchors may include the two anchors (i.e., anchor 106a and anchor 106b) seen in the cross sectional view of FIG. 1, and two anchors (not shown) that are in a plane perpendicular to FIG. 1.

The 3-degrees-of-freedom (3-DOF) gyroscope structures described herein have two masses in the X-Y plane: a dynamic or proof mass, which is driven to resonance (e.g., by drive electrodes), and a static mass to serve as a platform. The dynamic mass is connected to the static mass, and the static mass is connected to the substrate. The platform is anchored to the substrate at four locations of the symmetrically placed four off-center anchors. The suspension of the platform and connected dynamic mass from the geometrically distributed four anchors effectively averages the out-of-plane displacement of the dynamic mass with respect to stress-induced substrate warpage or bending of the substrate across these four locations, thus reducing asymmetric gap changes due to stress.

The 3-degrees-of-freedom (3-DOF) gyroscope in device layer 105 may be implemented as an Inner Electrode version or as an Outer Electrode version of the gyroscope in device layer 105. While the mechanism of stress sensitivity reduction is similar in both versions, a primary difference between the two versions is the placement of the out-of-plane electrodes in the gyroscope. Inner Electrode version: The pairs of out-of-plane X axis electrodes and Y axis electrodes (on wafer 103) are placed close to the center of the gyroscope. Outer Electrode version: The pairs of out-of-plane X axis electrodes and Y axis electrodes (on wafer 103) are placed away from the center and toward the edges of the gyroscope.

Figure 2A:
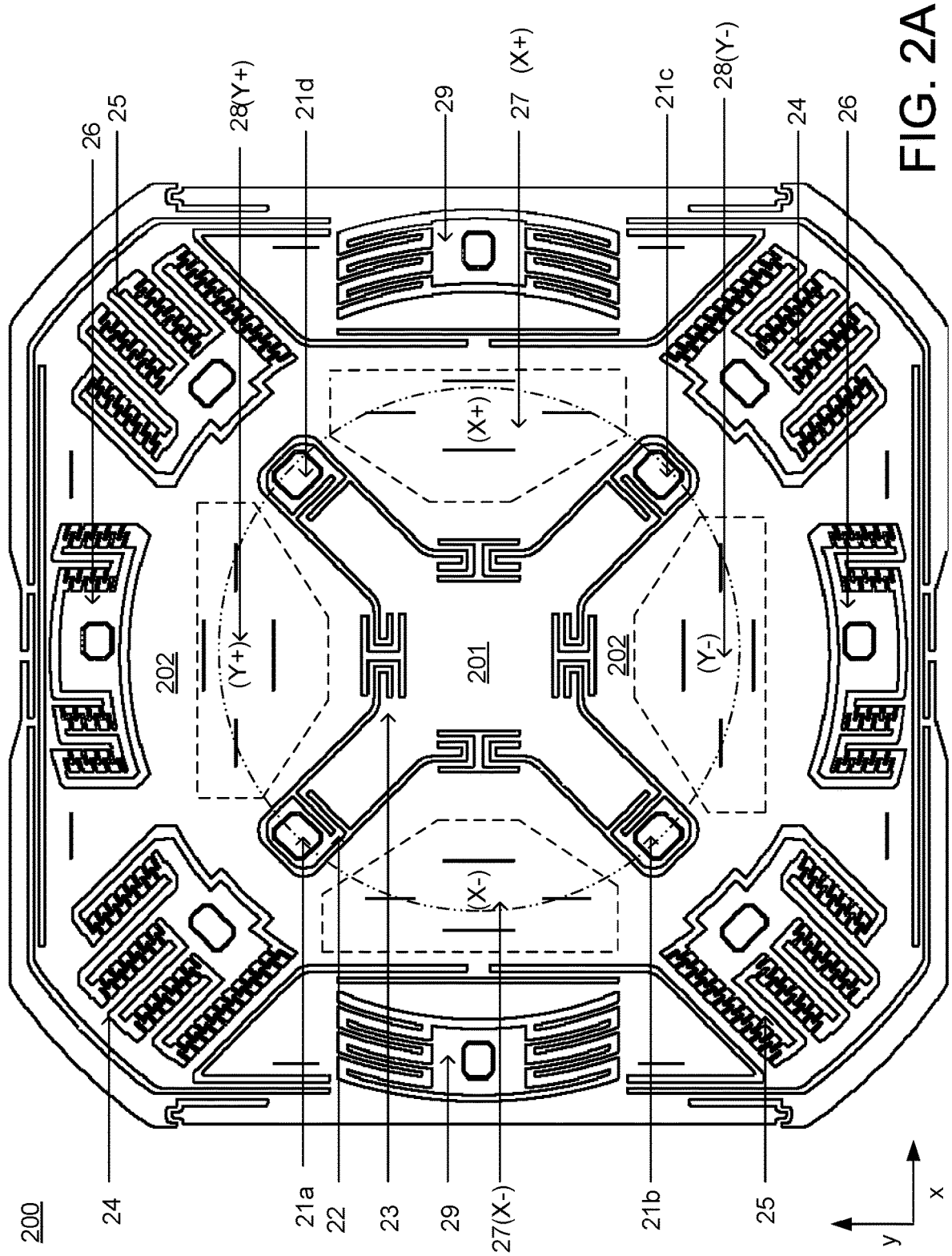
FIG. 2A is an illustration of an example Inner Electrode version gyroscope, in accordance with the principles of the present disclosure.

An example Inner Electrode version gyroscope 200 is shown in FIG. 2A, in accordance with the principles of the present disclosure.

Figure 2B:
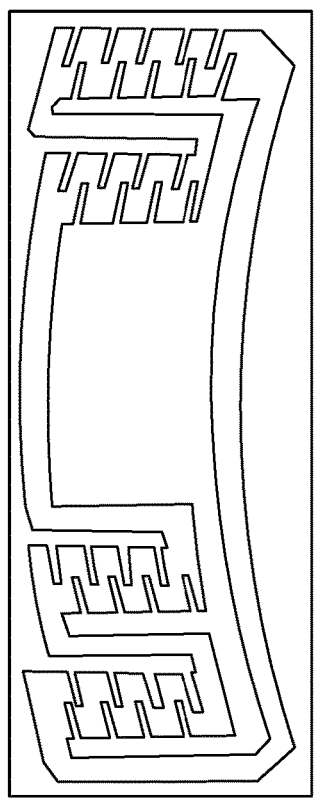
FIG. 2B is an illustration of comb finger structures of a clockwise drive and an anticlockwise drive actuator, a drive oscillation sense electrode, and a Z-axis rate sense electrode, in accordance with the principles of the present disclosure.
Figure 2B:
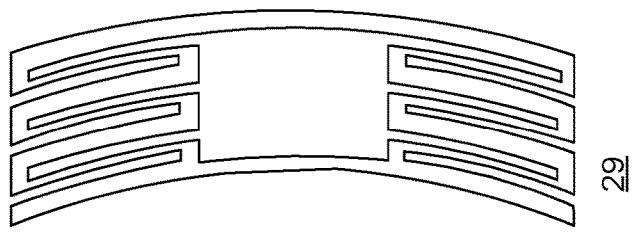
Figure 2B:
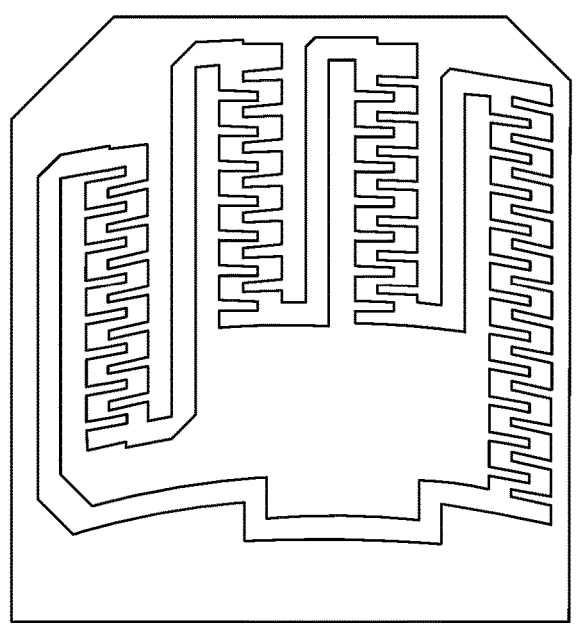

Inner Electrode version gyroscope 200, which may be fabricated in a device layer (e.g., device layer 105, FIG. 1), includes a static mass 201 and a dynamic mass 202 in the X-Y plane. Static mass 201, which may have an X shape o (a cross shape) is supported on the substrate (e.g., wafer 13) by four off-center anchors (e.g., anchors 21a, 21b, 21c, and 21d) via anchor suspension flexures (e.g., flexure 22). In example implementations, flexure 22 may include one more rectangular elastic hinges 22e (e.g., as shown in FIG. 2B). Dynamic mass 202 is suspended around static mass 201 via gyroscope central suspension flexures 23. Gyroscope central suspension flexures 23 which may be C-beam flexures, attach dynamic mass 202 to static mass 201 at about the bottoms of the four valleys of the X-shape of static mass 201. In example implementations, gyroscope central suspension flexures 23 may include one or more C-shape elements (i.e., C-beam flexures 23c) (FIG. 3B).

In the example inner electrode version gyroscope 200, out-of-plane X-axis sense electrodes 27 and Y-Axis sense electrodes 28 (which are disposed on wafer 103 below device layer 105) are placed close to the center of gyroscope 200 (e.g., at about midway between a center 35 and an edge 37 of gyroscope 200). Further, the center-of-mass of the X-Axis and Y-Axis sense electrodes are placed at the same radial distance from the center of gyroscope 200 as the four anchors (i.e. anchors 21a, 21b, 21c, and 21d).

Gyroscope 200 also includes various in-plane drive and sensing electrodes. For example, gyroscope 200 includes two pairs of drive electrodes (e.g., a pair of clockwise drive actuators 24 and a pair of anti-clockwise drive actuators 25), a pair of sensing electrodes (e.g., drive oscillation sense electrodes 26), and a pair of Z-axis rate sense electrodes 29 that are disposed at distances from the center of gyroscope 200 toward the outer edges (e.g., edge 37) of gyroscope 200. Clockwise drive actuators 24, anti-clockwise drive actuators 25, drive oscillation sense electrodes 26, and Z-axis rate sense electrodes 29 can, for example, be comb finger structures. FIG. 2B, for purposes of illustration of these comb finger structures, shows exploded views of a clockwise drive actuator 24, a drive oscillation sense electrode 26, and a Z-axis rate sense electrode 29.

In gyroscope 200, the various in-plane drive and sensing electrodes (e.g., clockwise drive actuators 24, anti-clockwise drive actuators 25, drive oscillation sense electrodes 26, and Z-axis rate sense electrodes 29) are attached to the substrate (e.g., wafer 103), for example, via anchors (e.g., anchors 30).

A Z-axis rotary oscillation mode of gyroscope 200 can be actuated, for example, by using clockwise drive actuator 24 to drive dynamic mass 202 (which is suspended symmetrically about the four anchors 21a-21d) in a clockwise direction, and using anti-clockwise drive actuator 25 to drive dynamic mass 202 in an anti-clockwise direction. Drive oscillation sense electrodes 26 can sense oscillation of dynamic mass 202 and provide feedback to a drive circuit (not shown) that drives clockwise drive actuators 24 and anti-clockwise drive actuator 25 to, for example, drive dynamic mass 202 to resonance.

Figure 3A:
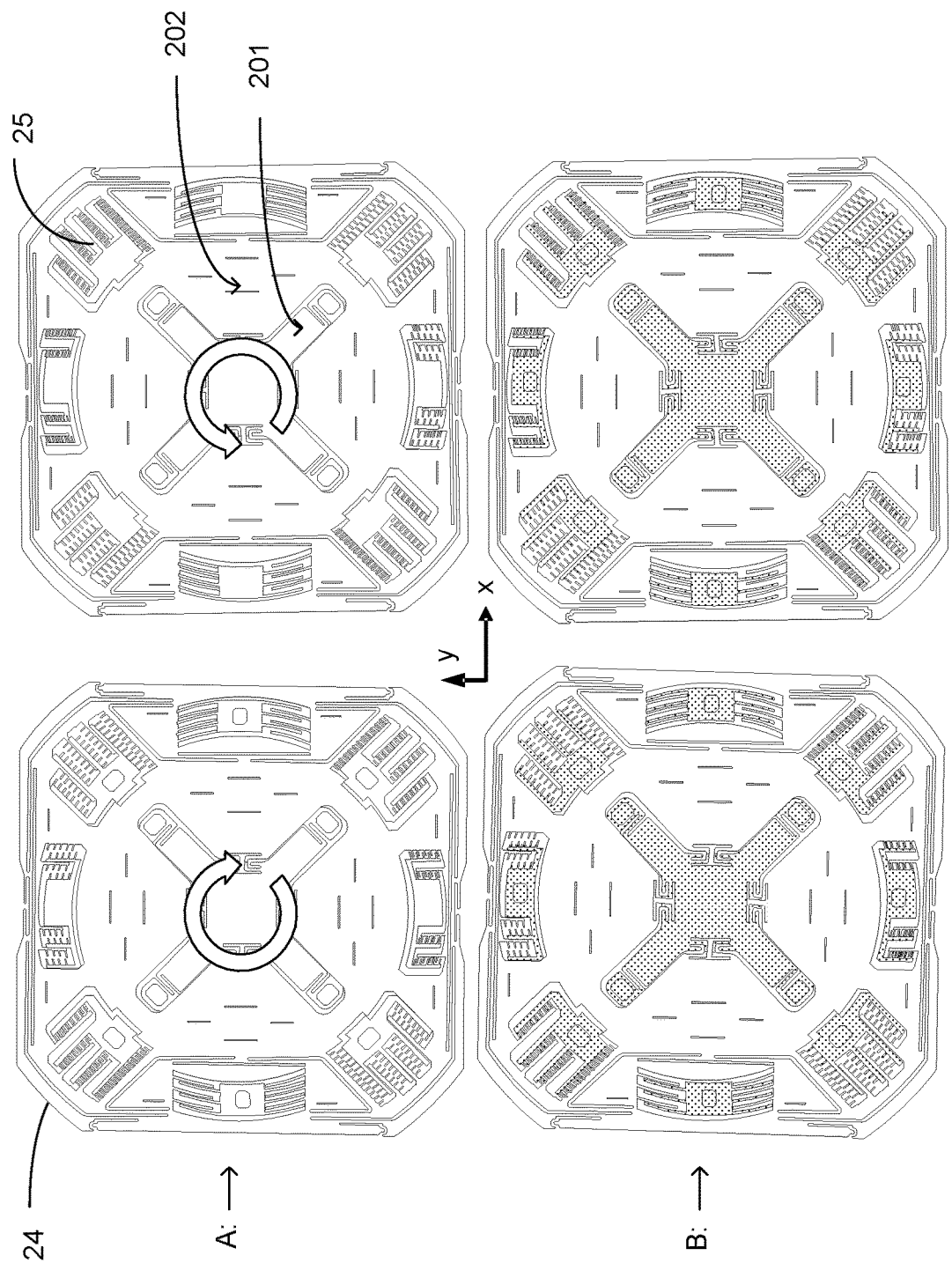
FIG. 3A is an illustration of views of clockwise and counterclockwise rotations of the example Inner Electrode version gyroscope (of FIG. 2A) by the clockwise drive actuator and the anticlockwise drive actuator, in accordance with the principles of the present disclosure.
Figure 3B:
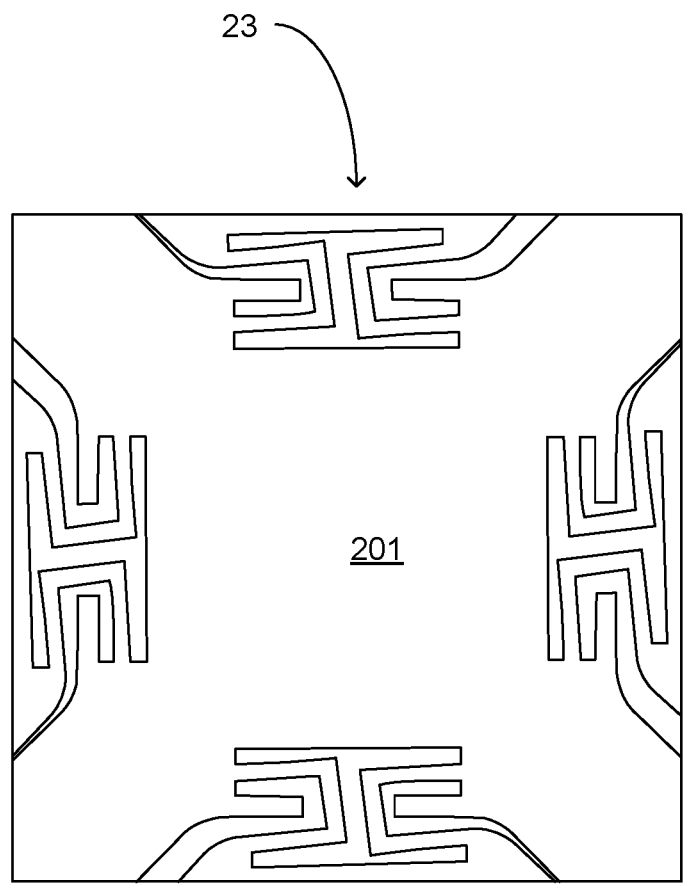
FIG. 3B is an illustration of central suspension flexures at the center of a gyroscope (of FIG. 2A) under the rotation, in accordance with the principles of the present disclosure.

FIG. 3A shows views of clockwise and counterclockwise rotations of the example Inner Electrode version gyroscope (of FIG. 2A) by the clockwise drive actuator and the anticlockwise drive actuator, in accordance with the principles of the present disclosure.

FIG. 3A, in row A, shows views of the gyroscope being rotated clockwise and counterclockwise by clockwise drive actuators 24 and the anticlockwise drive actuators 25, respectively. Further, FIG. 3A, in row B, shows views of a modeled simulation of the displacements of the gyroscope being rotated clockwise and counterclockwise by clockwise drive actuators 24 and the anticlockwise drive actuators 25, respectively. (In FIG. 3A, row B, darker shading indicates low displacement values and lighter shading indicates high displacement values)

In operation, a Z-axis rotary oscillation drive on gyroscope 200 can be a high amplitude drive. The symmetric c-beam flexures (gyroscope central suspension flexures 23) at the center of gyroscope 200 provide mechanical quadrature cancellation (as illustrated in exploded view, for example, in FIG. 3B).

Further, in-plane differential comb finger electrodes for Z-Axis Rate Sense (i.e., Z-axis rate sense electrodes 29) can be used to sense a Coriolis rate response.

Figure 3C:
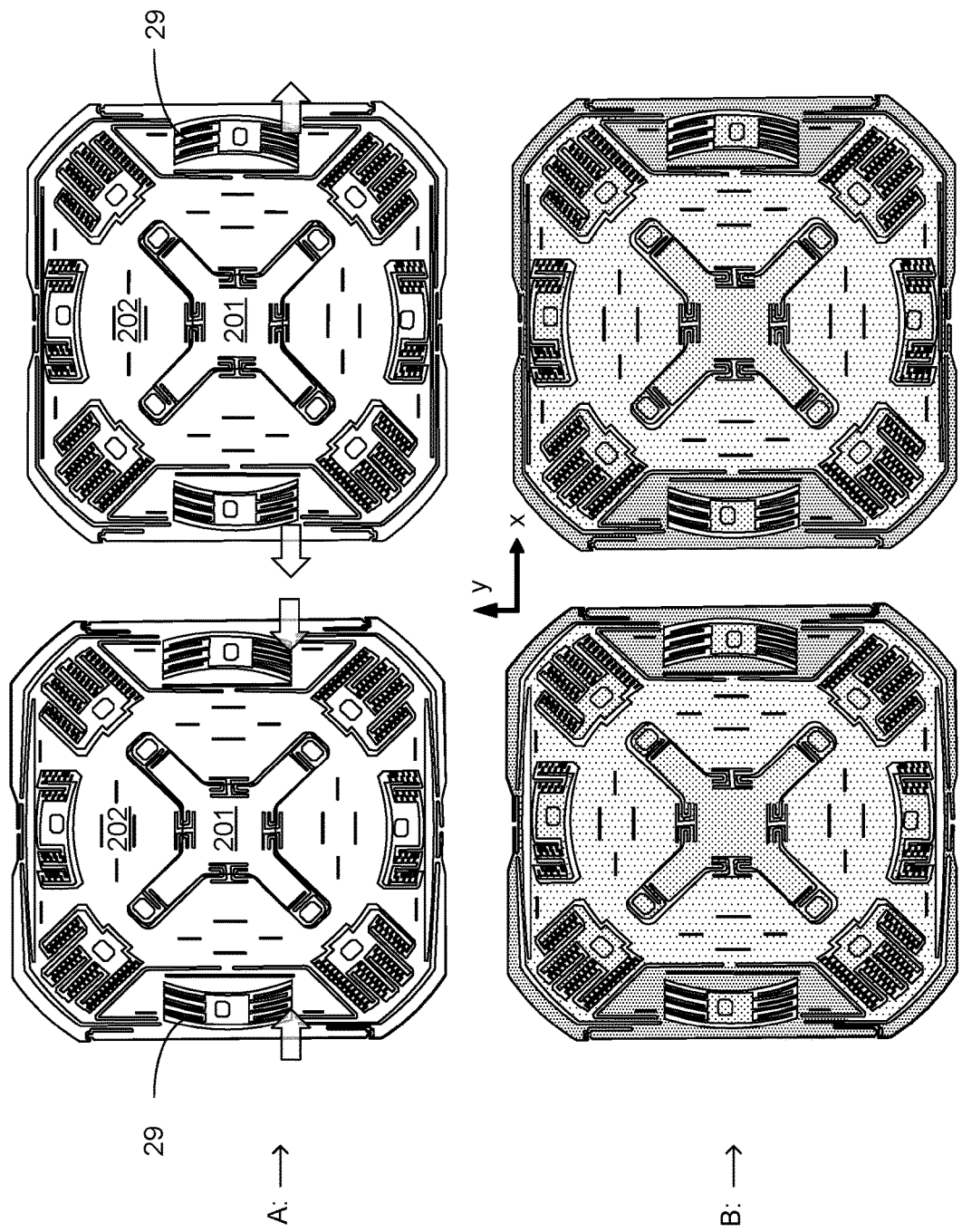
FIG. 3C is an illustration of Z-axis rate sensing in the gyroscope of FIG. 2A, in accordance with the principles of the present disclosure.

FIG. 3C, in row A, shows examples of the compressive and expansive motion of the gyroscope (of FIG. 2A) driven by Z-axis rate sense electrodes 29 to sense the Coriolis rate response, in accordance with the principles of the present disclosure. Further, FIG. 3C, in row B, shows views of a modeled simulation of the displacements of the gyroscope driven by Z-axis rate sense electrodes 29 to sense the Coriolis rate response. (In FIG. 3C, row B, darker shading indicates lower displacement values and lighter shading indicates higher displacement values).

Figure 4:
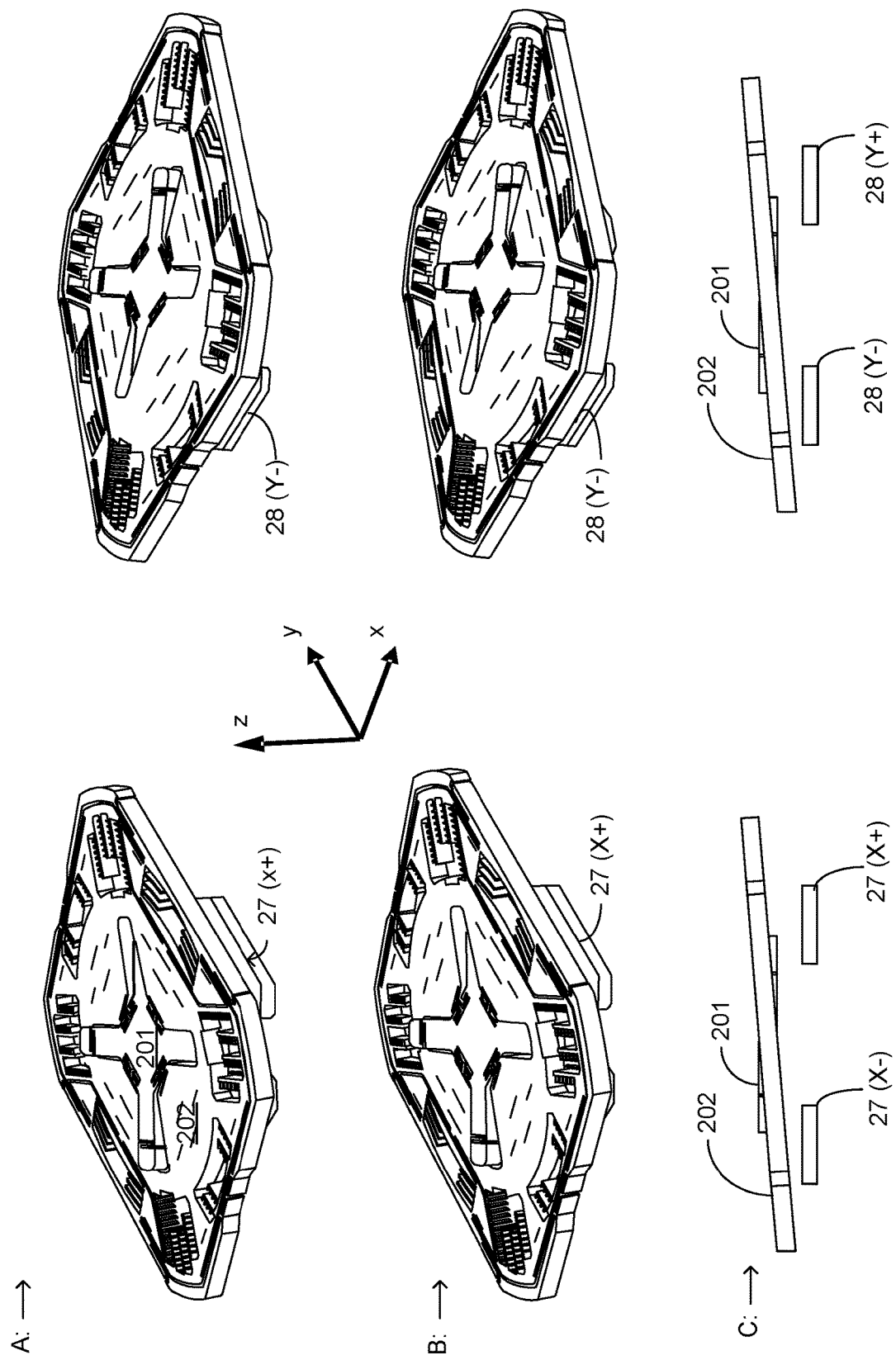
FIG. 4 is an illustration of X-axis and Y-axis rate sensing in the gyroscope, in accordance with the principles of the present disclosure.

Further, the out-of-plane X-Axis rate sense electrodes (i.e., electrodes 27 (X−) and 27 (X+)) and out-of-plane Y-Axis rate sense electrodes (i.e., electrodes 28 (Y−) and 28 (Y+)) can sense the Coriolis rate response (as shown, for example, in FIG. 4).

FIG. 4, in row A, shows in perspective view, two examples of the motion of the gyroscope (of FIG. 2A) driven by X-axis rate sense electrodes 27 and Y-axis rate sense electrodes 28, respectively, to sense the Coriolis rate response, in accordance with the principles of the present disclosure. Further, FIG. 4, in row B, shows views of a modeled simulation of the displacements of the gyroscope driven by X-axis rate sense electrodes 27 and Y-axis rate sense electrodes 28, respectively, to sense the Coriolis rate response. Further, FIG. 4, in row C, shows cross sectional views of the modeled simulation of the displacements of the gyroscope (shown in row B) driven by X-axis rate sense electrodes 27 and Y-axis rate sense electrodes 28, respectively, to sense the Coriolis rate response. (In FIG. 4, row B and row C, darker shading indicates lower displacement values and lighter shading indicates higher displacement values).

Figure 5A:
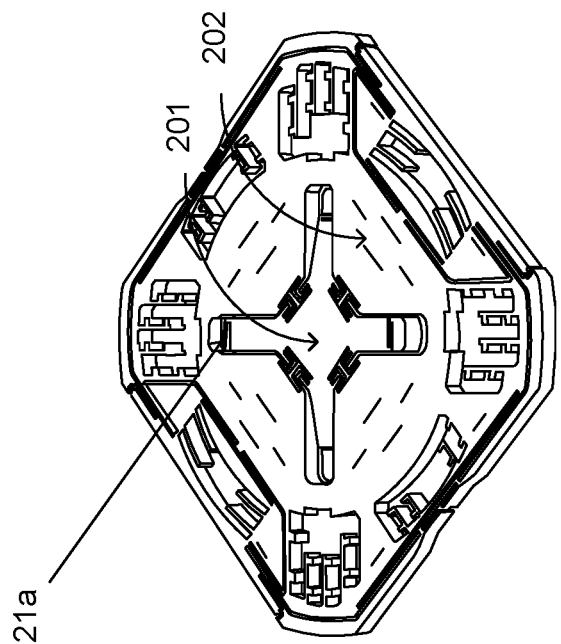
FIG. 5A is a schematic view of a finite element simulation of a test scenario in which stress on a gyroscope substrate (in the gyroscope of FIG. 2A) is modelled as an out-of-plane deformation of a single anchor, in accordance with the principles of the present disclosure.
Figure 5A:
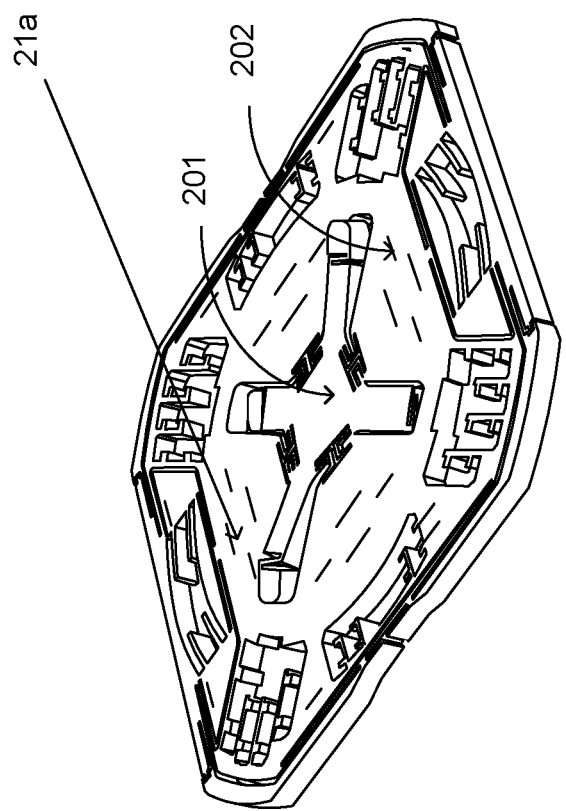
Figure 5B:
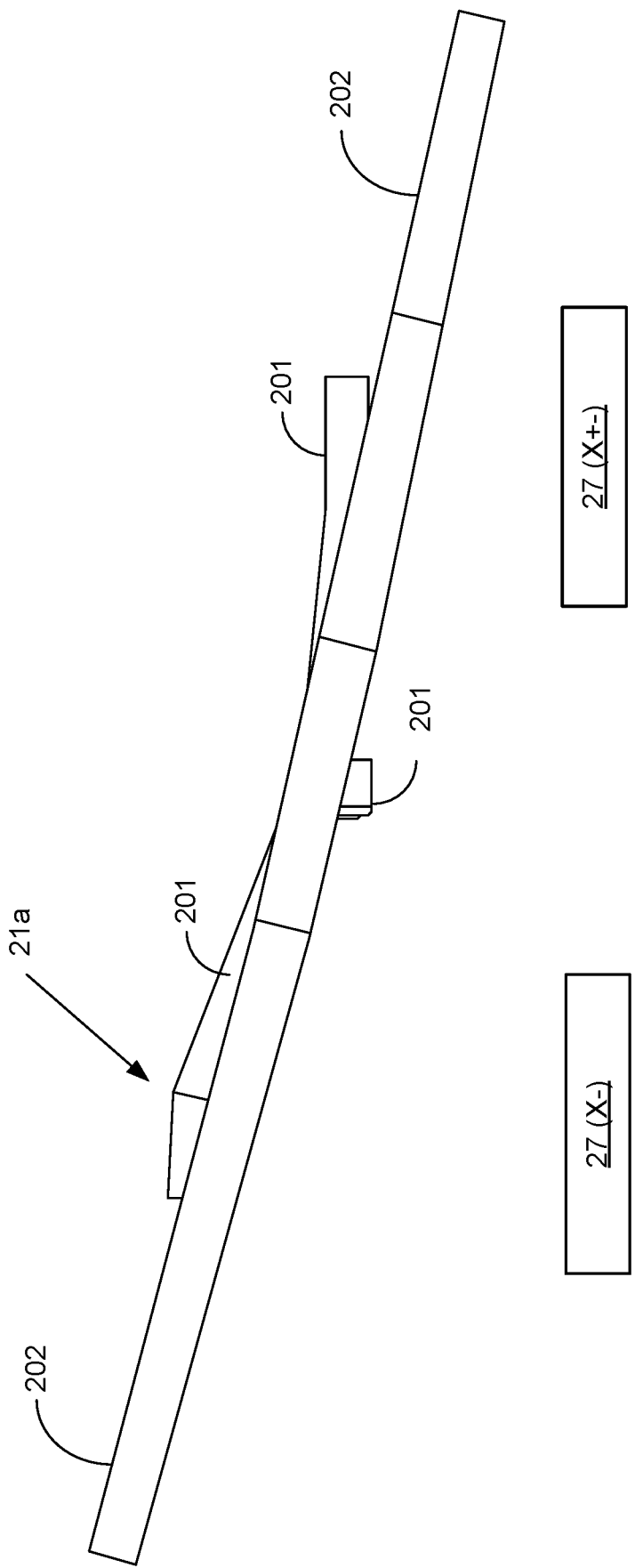
FIG. 5B is cross sectional view of the finite element simulation of the test scenario (of FIG. 5A) in which stress on a gyroscope substrate is modelled as an out-of-plane deformation of a single anchor, in accordance with the principles of the present disclosure.

FIG. 5A is schematic view of a finite element simulation of a test scenario in which stress on the substrate (e.g., wafer 13) is modelled as an extreme out-of-plane deformation of a single anchor (e.g., anchor 21a) of the four anchors (e.g., anchors 21a, 21b, 21c, and 21d) on which gyroscope 200 is suspended (FIG. 2A). FIG. 5B is cross sectional view of the finite element simulation of the test scenario (of FIG. 5A) in which stress on a gyroscope substrate is modelled as an out-of-plane deformation of a single anchor.

As a result of the out-of-plane anchor deformation, nominally planar gyroscope components (i.e. static mass 201 and dynamic mass 202) are also deformed. FIGS. 5A and 5B show, for example, static mass 201 as being noticeably deformed. However, because of the geometrically distributed suspension of the gyroscope components on multiple anchors (e.g., the four anchors 21a, 21b, 21c, and 22d) there is reduced sensitivity of the out-of-plane rate sense electrodes of both X and Y axis (i.e., electrodes 27 (X−) and 27 (X+), and electrodes 28 (Y−) and 28 (Y+)) to the deformation. The four anchors track substrate deformation and average the capacitive gaps (between the out-of-plane rate sense electrodes and dynamic mass 202) to mitigate the differences in deformation displacements.

Figure 6:
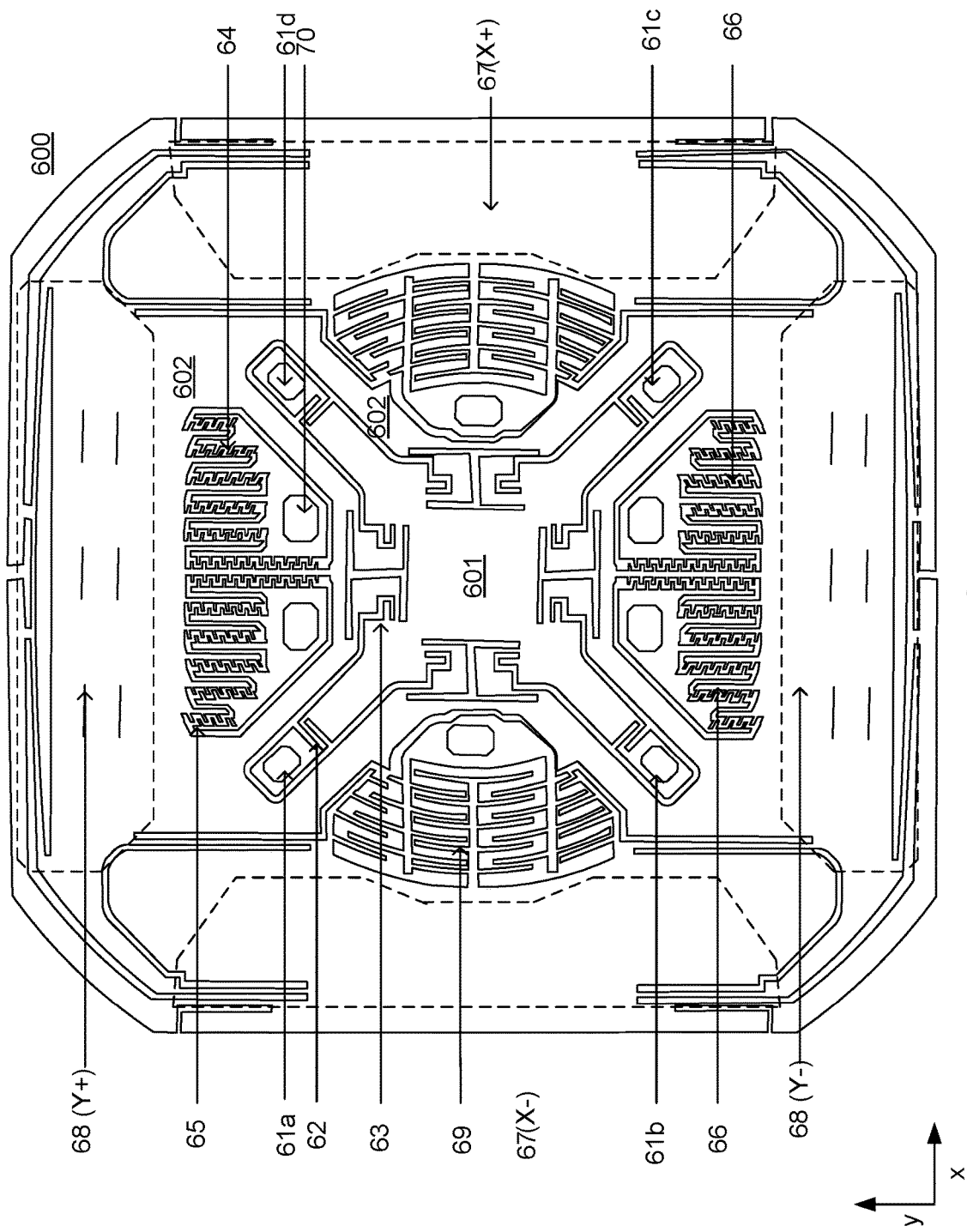
FIG. 6 is an illustration of an example Outer Electrode version gyroscope, in accordance with the principles of the present disclosure.

An example Outer Electrode version gyroscope 600 is shown in FIG. 6, in accordance with the principles of the present disclosure. Inner Electrode version gyroscope 600, which may be fabricated in a device layer (e.g., device layer 105, FIG. 1), includes a static mass 601 and a dynamic mass 602 in the X-Y plane. Static mass 601, which may have an X or a cross shape is supported on the substrate (e.g., wafer 13) by four off-center anchors (e.g., anchors 61a, 61b, 61c, and 61d) via anchor suspension flexures (e.g., flexure 62). Dynamic mass 602 is suspended around static mass 201 via gyroscope central suspension flexures 63. Gyroscope central suspension flexures 63, which may be C-beam flexures, attach dynamic mass 602 to static mass 601 at about the bottoms of the four valleys of the X-shape of static mass 601.

In the example Outer Electrode version gyroscope 600, out-of-plane X-Axis rate sense electrodes (i.e., electrodes 67 (X−) and 67 (X+)) and out-of-plane Y-Axis rate sense electrodes (i.e., electrodes 268 (Y−) and 68 (Y+) (which are disposed on wafer 103 below device layer 105) are placed close to the outer edges of gyroscope 600 away from the center of gyroscope 600.

Gyroscope 600 also includes various in-plane drive and sensing electrodes. For example, gyroscope 600 includes a pair of drive electrodes (e.g., clockwise drive actuator 64 and an anti-clockwise drive actuator 65), a pair of sensing electrodes (e.g., drive oscillation sense electrodes 26), and a pair of Z-axis rate sense electrodes 69 that are disposed toward the outer edges of gyroscope 200 away from the center of gyroscope 200. Clockwise drive actuator 64, anti-clockwise drive actuator 65, a pair of drive oscillation sense electrodes 66, and a pair of Z-axis rate sense electrodes 69 can, for example, be comb finger structures.

The various in-plane drive and sensing electrodes (e.g., clockwise drive actuator 64, anti-clockwise drive actuator 65, drive oscillation sense electrodes 66, and Z-axis rate sense electrodes 69) are attached to the substrate (e.g., wafer 103), for example, via anchors (e.g., anchors 70).

A Z-axis rotary oscillation mode of gyroscope 600 can be actuated, for example, by using clockwise drive actuator 64 to drive dynamic mass 602 (which is suspended symmetrically about the four anchors 61a-61d) in a clockwise direction, and using anti-clockwise drive actuator 65 to drive dynamic mass 602 in an anti-clockwise direction. Drive oscillation sense electrodes 66 can sense drive oscillation and provide feedback to a drive circuit (not shown) that drives clockwise drive actuator 64 and anti-clockwise drive actuator 65.

Figure 7A:
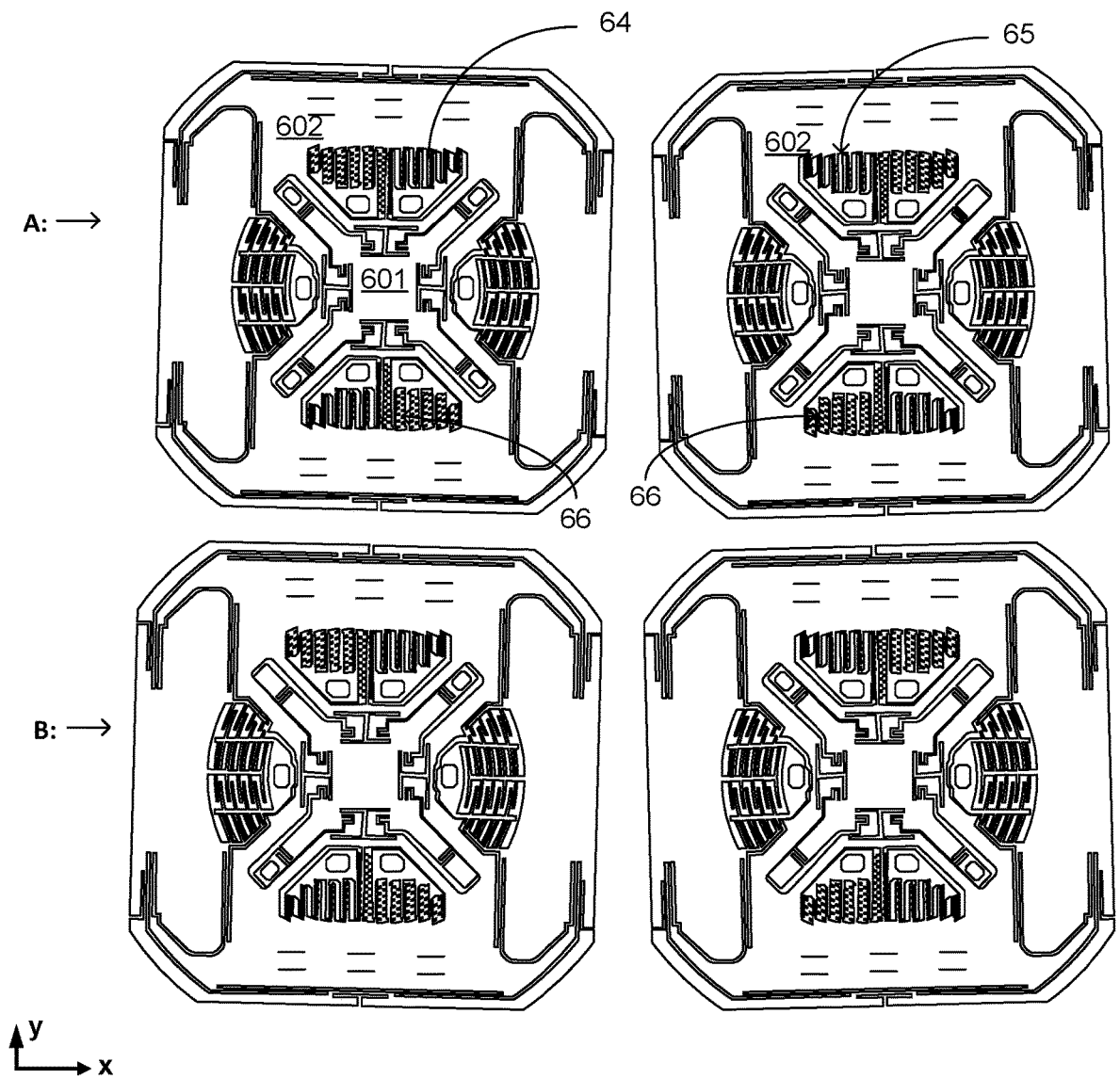
FIG. 7A is an illustration of views of clockwise and counterclockwise rotations of the example Outer Electrode version gyroscope (of FIG. 6) by the clockwise drive actuator and the anticlockwise drive actuator, in accordance with the principles of the present disclosure.

FIG. 7A shows views of clockwise and counterclockwise rotations of the example Outer Electrode version gyroscope (of FIG. 6) by the clockwise drive actuator and the anti-clockwise drive actuator, in accordance with the principles of the present disclosure.

FIG. 7A, in row A, shows views of the gyroscope being rotated clockwise and counterclockwise by clockwise drive actuator 64 and the anticlockwise drive actuators 65, respectively. Further, FIG. 7A, in row B, shows, views of a modeled simulation of the displacements of the gyroscope being rotated clockwise and counterclockwise by clockwise drive actuators 64 and the anticlockwise drive actuators 65, respectively. (In FIG. 7A, row B, darker shading indicates low displacement values and lighter shading indicates high displacement values).

Figure 7B:
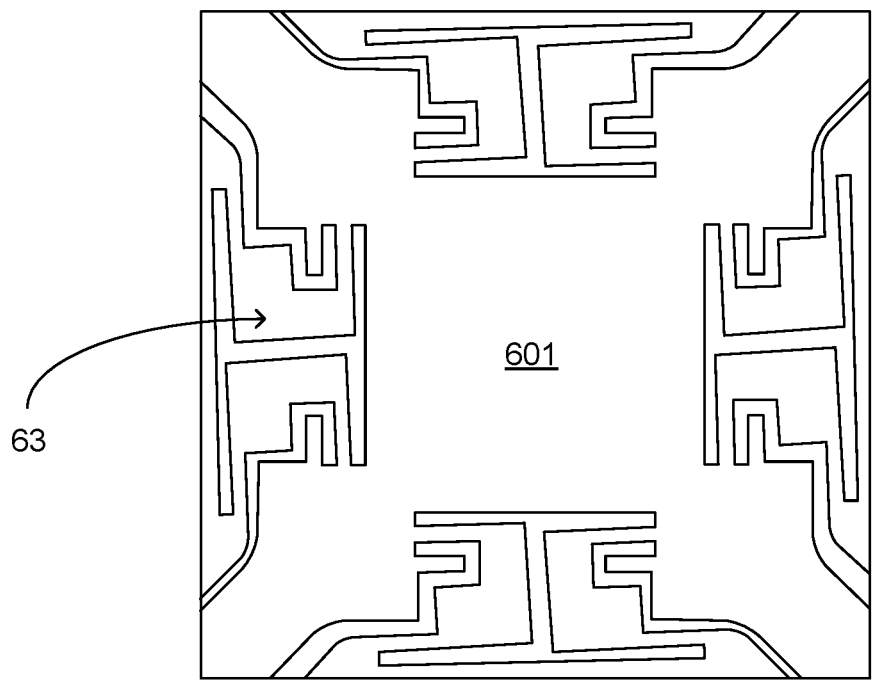
FIG. 7B is an illustration of the gyroscope central suspension flexures at the center of the gyroscope under rotation (of FIG. 7A), in accordance with the principles of the present disclosure.

In operation, a Z-axis rotary oscillation drive on gyroscope 600 can be a high amplitude drive. The symmetric C-beam flexures (gyroscope central suspension flexures 63) at the center of gyroscope 600 provide mechanical quadrature cancellation (as illustrated in exploded view, for example, in FIG. 7B).

Further, in-plane differential comb finger electrodes for Z-Axis rate sense (i.e., Z-axis rate sense electrodes 69) can be used to sense a Coriolis rate response of gyroscope 600.

Figure 7C:
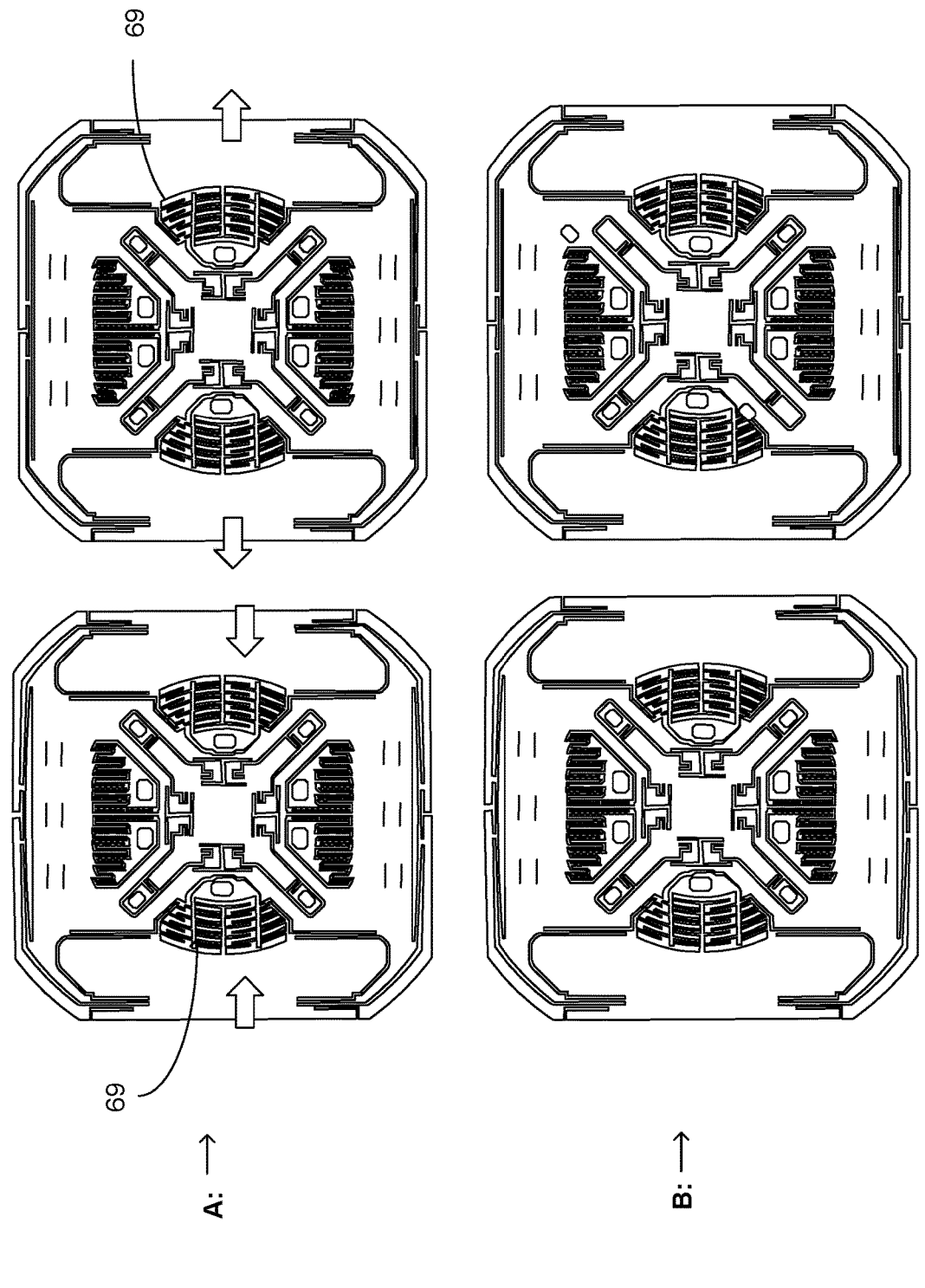
FIG. 7C is an illustration of Z-axis rate sensing in the gyroscope of FIG. 6, in accordance with the principles of the present disclosure.

FIG. 7C, in row A, shows examples of the compressive and expansive motion of the gyroscope (of FIG. 6) driven by Z-axis rate sense electrodes 69 to sense the Coriolis rate response, in accordance with the principles of the present disclosure. Further, FIG. 7C, in row B, shows views of a modeled simulation of the displacements of the gyroscope driven by Z-axis rate sense electrodes 69 to sense the Coriolis rate response. (In FIG. 7C, row B, darker shading indicates lower displacement values and lighter shading indicates higher displacement values).

Figure 8:
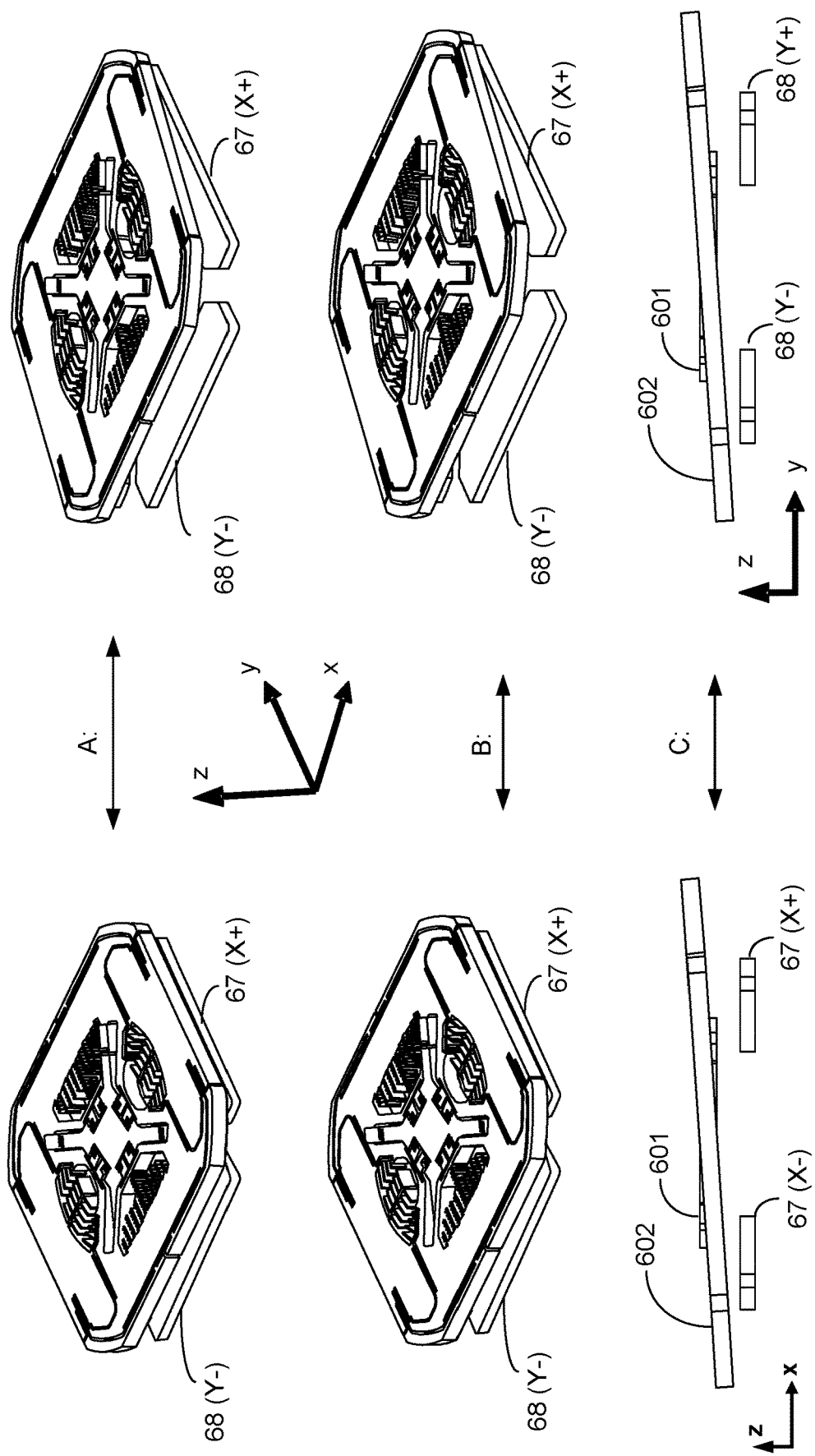
FIG. 8 is an illustration of X-axis and Y-axis rate sensing in the gyroscope of FIG. 6, in accordance with the principles of the present disclosure.

Additionally, the out-of-plane X-Axis rate sense electrodes (i.e., electrodes 67 (X−) and 67 (X+)) and out-of-plane Y-Axis rate sense electrodes (i.e., electrodes 68 (Y−) and 68 (Y+)) can sense the Coriolis rate response (as shown, for example, in FIG. 8).

FIG. 8, in row A, shows perspective views of two examples of the motion of the gyroscope (of FIG. 6) driven by X-axis rate sense electrodes 67 and Y-axis rate sense electrodes 68, respectively, to sense the Coriolis rate response, in accordance with the principles of the present disclosure. Further, FIG. 8, in row B, shows views of a modeled simulation of the displacements of the gyroscope driven by X-axis rate sense electrodes 67 and Y-axis rate sense electrodes 68, respectively, to sense the Coriolis rate response. Further, FIG. 8, in row C, shows cross sectional views of the modeled simulation of the displacements of the gyroscope (shown in row B) driven by X-axis rate sense electrodes 67 and Y-axis rate sense electrodes 68, respectively, to sense the Coriolis rate response. (In FIG. 8, row B and row C, darker shading indicates lower displacement values and lighter shading indicates higher displacement values).

Figure 9:
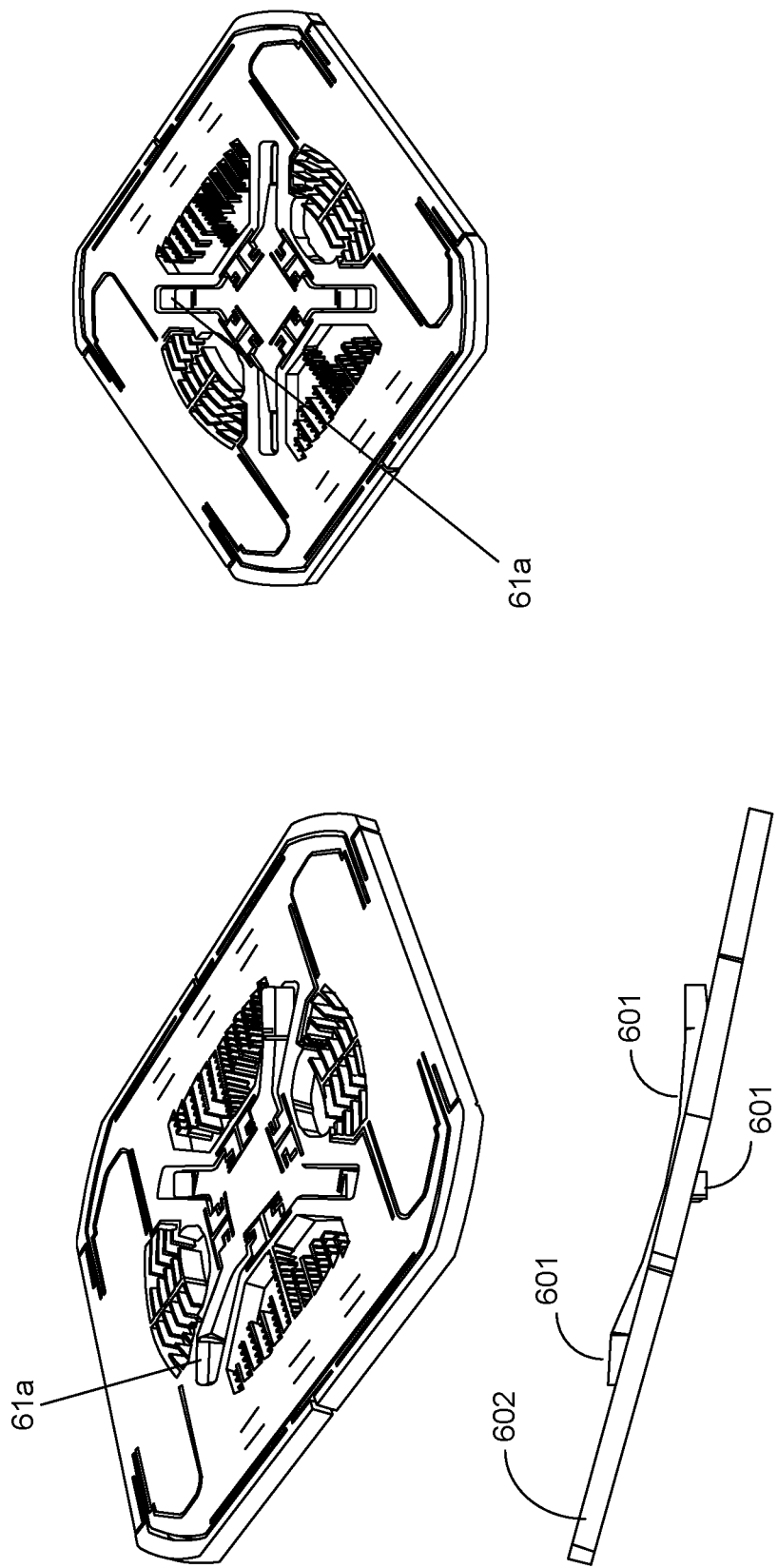
FIG. 9 is a schematic view of a finite element simulation of a test scenario in which stress on a gyroscope substrate (in the gyroscope of FIG. 6) is modelled as an out-of-plane deformation of a single anchor, in accordance with the principles of the present disclosure.

FIG. 9 is schematic view of a finite element simulation of a test scenario in which stress on the substrate (e.g., wafer 13) of gyroscope 600 is modelled as an extreme out-of-plane deformation of a single anchor (e.g., anchor 61a) of the four anchors (e.g., anchors 61a, 61b, 61c, and 62d) on which gyroscope 600 is suspended (FIG. 6). Two perspective views and a cross sectional view of the simulated gyroscope 600 are shown FIG. 9.

As discussed above in the case of gyroscope 200, because of the suspension of gyroscope 600 on geometrically distributed multiple anchors (e.g., the four anchors 61a, 61b, 61c, and 62d) there is reduced sensitivity of the out-of-plane rate sense electrodes of both X and Y axis (i.e., electrodes 67 (X−) and 67 (X+), and electrodes 68 (Y−) and 68 (Y+)) to the deformation. The four anchors track substrate deformation and average the capacitive gaps (between the out-of-plane rate sense electrodes and dynamic mass 602) to mitigate the differences in deformation displacements across the substrate.

FIG. 10 shows an example method 1000 for mitigating or averaging deformation displacements across a substrate in a micromachined gyroscope.

Method 1000 includes suspending a static mass of a micromachined gyroscope in an x-y plane over a substrate by a plurality of anchors attached to the substrate (1010). The static mass can be attached to the anchors by anchor suspension flexures. Method 1000 further includes suspending a dynamic mass of the micromachined gyroscope from the static mass by one or more gyroscope suspension flexures (1020). The dynamic mass can surround the static mass.

In example implementations, in method 1000, suspending the static mass in an x-y plane over the substrate 1010 includes suspending the static mass over the substrate by a geometrically distributed arrangement of the plurality of anchors. The geometrically distributed arrangement of the anchors can average substrate deformation and average capacitive gaps between out-of-plane rate sense electrodes placed on the substrate and the dynamic mass.

In example implementations, in method 1000, suspending the static mass in an x-y plane over the substrate includes suspending the static mass over the substrate by a symmetrical arrangement of four anchors. Each of the four anchors can be attached to the substrate at about a same radial distance from a center of the gyroscope.

Method 1000 may further include disposing one or more sense electrodes on the substrate. The one or more sense electrodes may be configured to detect x-axis and y-axis acceleration of the dynamic mass.

In example implementations, disposing one or more sense electrodes configured to detect x-axis and y-axis acceleration of dynamic mass on the substrate can include disposing the one or more sense electrodes at about a midway between a center of the gyroscope and an outer edge of the gyroscope, and disposing one or more in-plane drive electrodes and one or more sensing electrodes toward an outer edge of the gyroscope.

In example implementations, disposing one or more sense electrodes configured to detect x-axis and y-axis acceleration of dynamic mass on the substrate can include disposing the one or more sense electrodes away from the center of the gyroscope at about at about an edge of the gyroscope, and disposing one or more in-plane drive electrodes and one or more sensing electrodes in a region of the gyroscope closer to the center of the gyroscope than the one or more sense electrodes configured to detect x-axis and y-axis acceleration of dynamic mass.

It will also be understood that when an element, such as a transistor or resistor, or gyroscope component, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application (if included) may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes an industrial motor driver, a solar inverter, ballast, a general-purpose half-bridge topology, an auxiliary and/or traction motor inverter driver, a switching mode power supply, an on-board charger, an uninterruptible power supply (UPS), a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that claims, if appended, are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A micromachined gyroscope comprising:
   a substrate;
   a static mass suspended in an x-y plane over the substrate by a plurality of anchors attached to the substrate, the static mass having an X shape, the static mass attached to the anchors by anchor suspension flexures; and
   a dynamic mass surrounding the static mass and suspended from the static mass by one or more gyroscope suspension flexures.

2. The micromachined gyroscope of claim 1, wherein the static mass is suspended in the x-y plane over the substrate by a geometrically distributed arrangement of the plurality of anchors, the geometrically distributed arrangement of the anchors tracking substrate deformation and averaging capacitive gaps between out-of-plane rate sense electrodes placed on the substrate and the dynamic mass.

3. The micromachined gyroscope of claim 1, wherein the plurality of anchors include a symmetrical arrangement of four anchors, each of the four anchors attached to the substrate at a same radial distance from a center of the gyroscope.

4. The micromachined gyroscope of claim 1, wherein the dynamic mass is attached to the static mass at bottoms of valleys of the X shape by the one or more gyroscope suspension flexures.

5. The micromachined gyroscope of claim 4, wherein the one or more gyroscope suspension flexures include a C-beam flexure.

6. The micromachined gyroscope of claim 1 further comprising one or more sense electrodes disposed on the substrate and configured to detect x-axis and y-axis acceleration of dynamic mass.

7. The micromachined gyroscope of claim 6, wherein the one or more sense electrodes configured to detect x-axis and y-axis acceleration of dynamic mass are disposed on the substrate at a midway between a center of the gyroscope and an edge of the gyroscope.

8. The micromachined gyroscope of claim 7, wherein each of the one or more sense electrodes configured to detect x-axis and y-axis acceleration of dynamic mass have a center-of-mass at a same radial distance from the center of the gyroscope as the radial distance from the center of the gyroscope to an anchor attached to the substrate.

9. The micromachined gyroscope of claim 8 further comprising one or more in-plane drive electrodes and one or more sensing electrodes disposed toward an edge of the gyroscope, the one or more in-plane drive electrodes and the one or more sensing electrodes being attached to the substrate by anchors.

10. The micromachined gyroscope of claim 6, wherein the one or more sense electrodes configured to detect x-axis and y-axis acceleration of dynamic mass are disposed on the substrate at an edge of the gyroscope.

11. The micromachined gyroscope of claim 10, further comprising one or more in-plane drive electrodes and one or more sensing electrodes disposed in a region of the gyroscope closer to a center of the gyroscope than the one or more sense electrodes configured to detect x-axis and y-axis acceleration of dynamic mass, the one or more in-plane drive electrodes and the one or more sensing electrodes attached to the substrate by anchors.

12. A method, comprising:
    suspending a static mass of a micromachined gyroscope in an x-y plane over a substrate by a plurality of anchors attached to the substrate, the static mass having an X shape, the static mass being attached to the anchors by anchor suspension flexures; and
    suspending a dynamic mass of the micromachined gyroscope from the static mass by one or more gyroscope suspension flexures.

13. The method of claim 12, wherein suspending the static mass in an x-y plane over the substrate includes suspending the static mass over the substrate by a geometrically distributed arrangement of the plurality of anchors, the geometrically distributed arrangement of the anchors tracking substrate deformation and averaging capacitive gaps between out-of-plane rate sense electrodes placed on the substrate and the dynamic mass.

14. The method of claim 12, wherein suspending the static mass in an x-y plane over the substrate includes suspending the static mass over the substrate by a symmetrical arrangement of four anchors, each of the four anchors attached to the substrate at a same radial distance from a center of the gyroscope.

15. The method of claim 12 further comprising:
    disposing one or more sense electrodes on the substrate, the one or more sense electrodes configured to detect x-axis and y-axis acceleration of dynamic mass.

16. The method of claim 15, wherein disposing one or more sense electrodes configured to detect x-axis and y-axis acceleration of dynamic mass on the substrate includes disposing the one or more sense electrodes at a midway between a center of the gyroscope and an edge of the gyroscope.

17. The method of claim 16 further comprising:
    disposing one or more in-plane drive electrodes and one or more sensing electrodes toward an edge of the gyroscope.

18. The method of claim 15, wherein disposing one or more sense electrodes configured to detect x-axis and y-axis acceleration of dynamic mass on the substrate includes disposing the one or more sense electrodes at an edge of the gyroscope.

19. The method of claim 18 further comprising disposing one or more in-plane drive electrodes and one or more sensing electrodes in a region of the gyroscope closer to a center of the gyroscope than the one or more sense electrodes configured to detect x-axis and y-axis acceleration of dynamic mass.

20. A micromachined gyroscope comprising:
    a substrate;
    a static mass suspended in an x-y plane over the substrate by a plurality of anchors attached to the substrate, the static mass attached to the anchors by anchor suspension flexures; and
    a dynamic mass surrounding the static mass and suspended from the static mass by one or more gyroscope suspension flexures, wherein the one or more gyroscope suspension flexures include a C-beam flexure.

* * * * *